(12) United States Patent
Fan et al.

(10) Patent No.: US 10,553,150 B2
(45) Date of Patent: Feb. 4, 2020

(54) ELECTRONIC DEVICE AND DISPLAY DEVICE COMPRISING THE SAME

(71) Applicant: InnoLux Corporation, Miao-Li County (TW)

(72) Inventors: Chia-Chieh Fan, Miao-Li County (TW); Wen-Chieh Lin, Miao-Li County (TW); Tong-Jung Wang, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 16/132,898

(22) Filed: Sep. 17, 2018

(65) Prior Publication Data

US 2019/0114957 A1  Apr. 18, 2019

(30) Foreign Application Priority Data

Oct. 18, 2017  (CN) .......................... 2017 1 0970101

(51) Int. Cl.
*G09G 3/32* (2016.01)
*H01L 27/15* (2006.01)
*G09F 9/33* (2006.01)
*H05K 3/32* (2006.01)

(52) U.S. Cl.
CPC ................. *G09G 3/32* (2013.01); *G09F 9/33* (2013.01); *H01L 27/15* (2013.01); *H05K 3/323* (2013.01)

(58) Field of Classification Search
None
See application file for complete search history.

(56) References Cited

U.S. PATENT DOCUMENTS

2013/0032943 A1* 2/2013 Cho ........................ H05K 1/181
257/773
2019/0269047 A1* 8/2019 Ma ........................ H05K 9/0054

* cited by examiner

*Primary Examiner* — Joseph R Haley
(74) *Attorney, Agent, or Firm* — Muncy, Geissler, Olds & Lowe, P.C.

(57) ABSTRACT

A display device is provided and includes: a display panel; and a circuit board electrically connected to the display panel and including: a substrate; a first conductive layer disposed on the substrate and including a first connecting pad and a second connecting pad; a second conductive layer disposed on and electrically connected to the second connecting pad; a first electronic component disposed on and electrically connected to the first connecting pad; and a second electronic component disposed on the second conductive layer and electrically connected to the second connecting pad through the second conductive layer. The first connecting pad has a first thickness. A total thickness of the second connecting pad and the second conductive layer is a second thickness. The second thickness is greater than the first thickness. A ratio of the second thickness to the first thickness ranges from 1.2 to 5000.

20 Claims, 3 Drawing Sheets

ELECTRONIC DEVICE AND DISPLAY DEVICE COMPRISING THE SAME

CROSS REFERENCE TO RELATED APPLICATION

This application claims the benefits of the Chinese Patent Application Serial Number 201710970101.5. filed on Oct. 18, 2017, the subject matter of which is incorporated herein by reference.

BACKGROUND

1. Field

The present disclosure relates to an electronic device and a display device comprising the same and, more particularly, to a display device with a specially designed circuit board.

2. Description of Related Art

Due to technological advances, there is a universal trend toward lightweight, thin, or compact electronic products with a view to satisfying consumer needs. Related manufacturers not only devote themselves to the development of increasingly thin display devices, but also attach great importance to narrow bezel design.

A conventional display device has a display panel and a circuit board. The display panel and the circuit board are electrically connected by a connecting element. Therefore, the presence of the connecting element places a limit on the thickness of the display device to some extent. Any attempt to reduce the thickness of the connecting element not only requires thinning the connecting element, but also entails mounting active components and passive components on the same substrate. However, active components differ from passive components in pin distance, and thus it is difficult to mount active components and passive components on the same substrate in a production process.

Therefore, it is imperative to provide a display device that is thin or has narrow bezels

SUMMARY

In view of the aforesaid drawbacks of the prior art, it is an objective of the present disclosure to mount active components and passive components on the same substrate, so as to effectively reduce the thickness of a display device, render a production process simple, or reduce costs.

In order to achieve the above and other objectives, the present disclosure provides a display device, comprising: a display panel; and a circuit board electrically connected to the display panel and comprising: a substrate; a first conductive layer disposed on the substrate and comprising a first connecting pad and a second connecting pad; a second conductive layer disposed on and electrically connected to the second connecting pad; a first electronic component disposed on and electrically connected to the first connecting pad; and a second electronic component disposed on the second conductive layer and electrically connected to the second connecting pad through the second conductive layer, wherein the first connecting pad has a first thickness, a total thickness of the second connecting pad and the second conductive layer is a second thickness, the second thickness is greater than the first thickness, and a ratio of the second thickness to the first thickness ranges from 1.2 to 5000.

The present disclosure further provides an electronic device, comprising: a substrate; a first conductive layer disposed on the substrate and comprising a first connecting pad and a second connecting pad; a second conductive layer disposed on and electrically connected to the second connecting pad; a first electronic component disposed on and electrically connected to the first connecting pad; and a second electronic component disposed on the second conductive layer and electrically connected to the second connecting pad through the second conductive layer, wherein the first connecting pad has a first thickness, a total thickness of the second connecting pad and the second conductive layer is a second thickness, the second thickness is greater than the first thickness, and a ratio of the second thickness to the first thickness ranges from 1.2 to 5000.

DETAILED DESCRIPTION

Implementation of the present disclosure is hereunder illustrated by specific embodiments. Persons skilled in the art can easily understand other advantages and effects of the present disclosure by referring to the disclosure contained in the specification. The present disclosure may also be implemented or applied according to various other specific embodiments. Various modifications and changes may be made to details disclosed in the specification in accordance with different viewpoints and applications without departing from the spirit of the present disclosure.

When an ordinal number (such as "first", "second", "third" and so on) is used as an adjective before a term used in the specification or the claims to describe an element disclosed in the specification or claimed by the claims, the ordinal number does not define implicitly/explicitly a limit to any feature identified with the element. Nor does the ordinal number indicate that a specific element has priority over another specific element or indicate the sequence of steps of a production method. Instead, the ordinal numbers are used merely to distinguish elements described by the same term.

Positional terms, such as "on top of", "on" and "above", may be used in the specification or the claims to refer to scenarios, including two elements in direct contact with each other, or two elements not in direct contact with each other.

Figure 2:
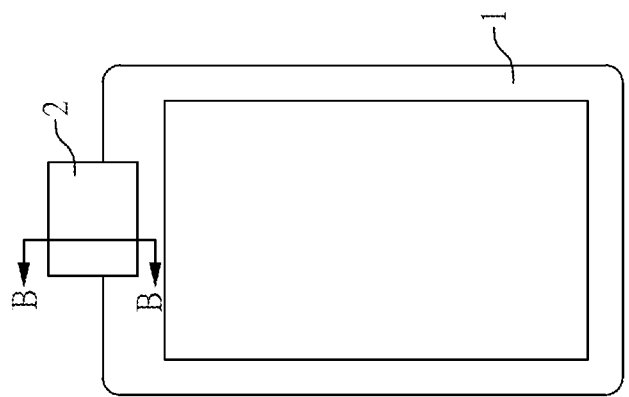
FIG. 2 is a schematic view of the display device according to another embodiment of the present disclosure.
Figure 1:
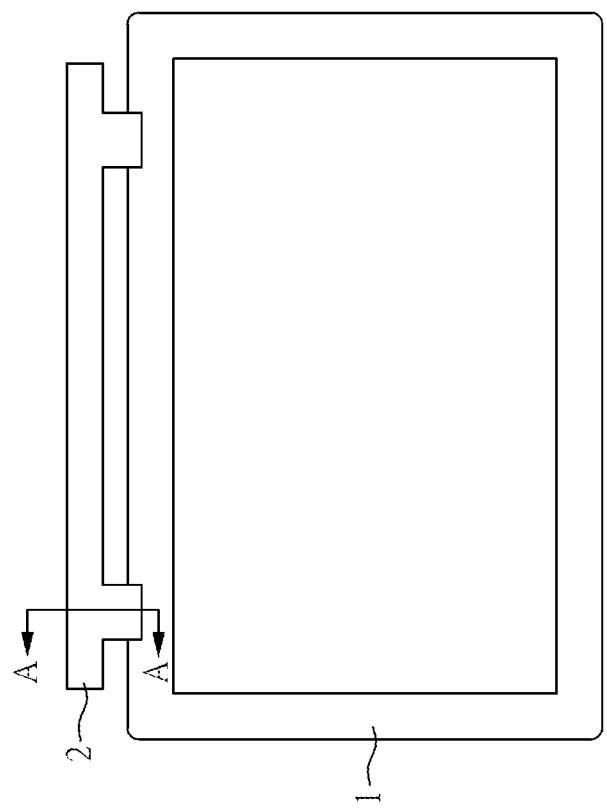
FIG. 1 is a schematic view of a display device according to an embodiment of the present disclosure.

Referring to FIG. 1 and FIG. 2, there are shown schematic views of a display device according to embodiments of the present disclosure, respectively. In an embodiment of the present disclosure, the display device comprises: a display panel 1; and an electronic device 2 electrically connected to the display panel 1. The display device is applicable to a display unit shown in FIG. 1 or a cell phone shown in FIG. 2, but the present disclosure is not limited thereto. According to the present disclosure, the display device is applicable to any conventional electronic devices which come with a display screen and display images, such as notebook computers, camcorders, cameras, music players, mobile navigation devices, flexible display, tiled display, OLED display (include micro LED and mini LED), QLED display, and TVs.

A process of producing the electronic device 2 according to the present disclosure is described below. According to the present disclosure, the production process involves: providing a carrier board (not shown), such as a glass carrier board; forming a substrate 21 on the carrier board; forming a patterned metal layer 27 on the substrate 21 by a photolithography process or an etching process; and forming a first insulating layer 28 on the patterned metal layer 27. The electronic device 2 can be a circuit board, but the present disclosure is not limited thereto. The material of the substrate 21 comprises polyethylene terephthalate, polyimide, polyethylene cycloalkane, epoxy resin, fiberglass cloth, or a mixture thereof. In this embodiment, the substrate 21 is a polyimide substrate, but the present disclosure is not limited thereto. The material for the patterned metal layer 27 may comprise gold, silver, copper, aluminum, molybdenum, titanium, or an alloy thereof, but the present disclosure is not limited thereto.

Afterward, metal is sputtered onto the first insulating layer 28 to form a first conductive layer 22. The first conductive layer 22 is in contact with the patterned metal layer 27 through a contact via. In this embodiment, the first conductive layer 22 is a sputtered metal copper layer, but the present disclosure is not limited thereto. For instance, the first conductive layer 22 may comprise a metal, such as gold, silver, copper, aluminum, molybdenum, titanium, or an alloy thereof. The first conductive layer 22 is a monolayer or a multilayer. Afterward, a second insulating layer 29 is formed, and the first conductive layer 22 is disposed between the first insulating layer 28 and the second insulating layer 29. The present disclosure is not restrictive of the materials which the first insulating layer 28 and the second insulating layer 29 comprise. According to the present disclosure, the first insulating layer 28 and the second insulating layer 29 comprise the same or different materials, such as silicon nitride, silicon oxide, silicon oxynitride, or a combination thereof However, the present disclosure is not limited thereto.

Afterward, a second conductive layer 23 and a third conductive layer 26 are plated to a second connecting pad 222 and a fourth connecting pad 224, respectively. The second conductive layer 23 and the third conductive layer 26 may comprise electrically conductive metal, such as gold, silver, copper, aluminum, molybdenum, titanium, or an alloy thereof Afterward, a first electronic component 24 is mounted on a first connecting pad 221 and a third connecting pad 223 by a thermal compressive bonding (TCB) process or a bonding process such that the first electronic component 24 is electrically connected to the first connecting pad 221 and the third connecting pad 223. A second electronic component 25 is mounted on the second conductive layer 23 and the third conductive layer 26 by a thermal compression process or a surface-mount technology (SMT) such that the second electronic component 25 is electrically connected to the second connecting pad 222 through the second conductive layer 23 and electrically connected to the fourth connecting pad 224 through the third conductive layer 26. Finally, the carrier board is removed, thereby finalizing the production process of the electronic device 2. The present disclosure is not restrictive of the sequence of the aforesaid steps. For instance, according to the present disclosure, it is feasible to mount the first electronic component 24 and the second electronic component 25 on the substrate 21 and then remove the carrier board. Alternatively, it is feasible to remove the carrier board and then mount the first electronic component 24 and the second electronic component 25 on the substrate 21. At last, the electronic device 2 and the display panel 1 are coupled together by a thermal compression process to form the display device of the present disclosure. Optionally, the thermal compression process requires using an anisotropic conductive film (ACF).

In an embodiment of the present disclosure, a first adhesive element 241 on the first electronic component 24 is bonded to the first connecting pad 221 and the third connecting pad 223 by an ACF bonding process or a thermal compressive bonding (TCB) process. The second electronic component 25 is electrically connected to the second conductive layer 23 and the third conductive layer 26 through a second adhesive element 251 (ex. by a surface-mount technology, SMT). In this embodiment, the first adhesive element 241 is an ACF or any other adhesive material, and the second adhesive element 251 is a solder or any other adhesive material, but the present disclosure is not limited thereto.

Figure 3:
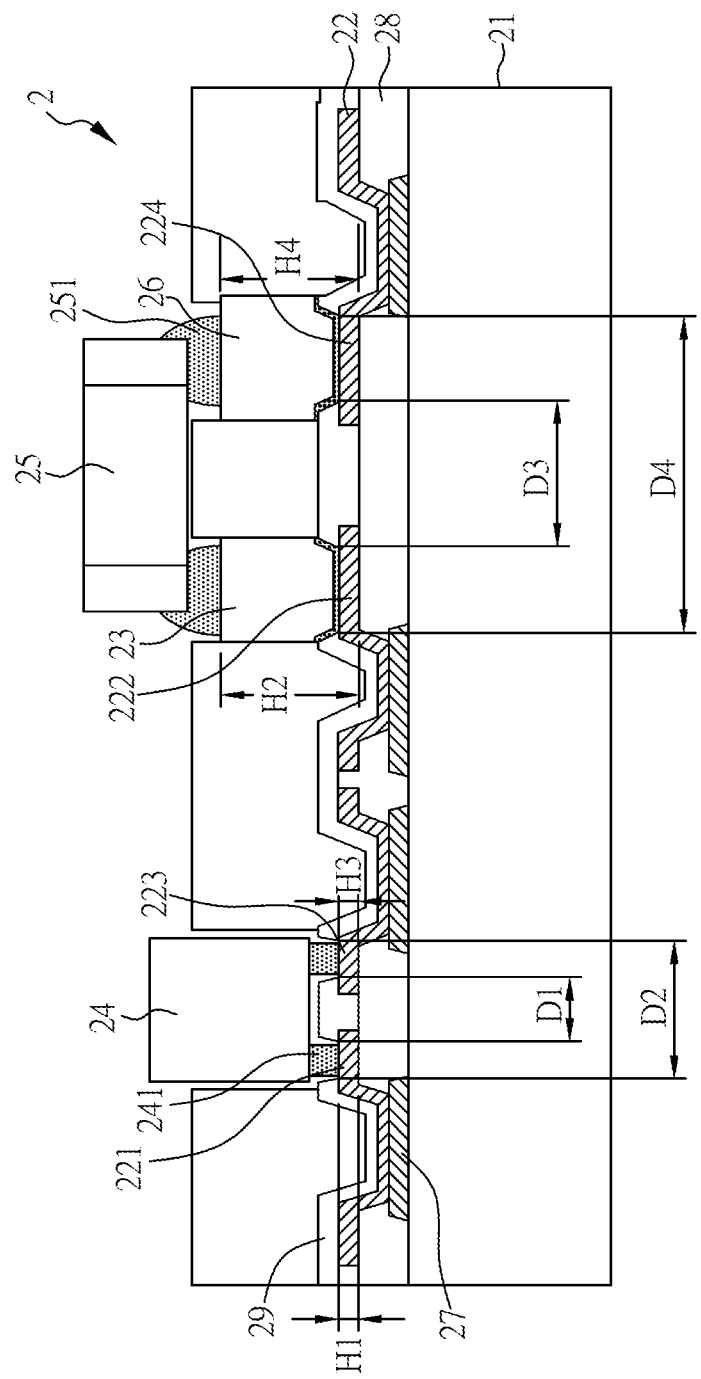
FIG. 3 is a cross-sectional view of an electronic device according to an embodiment of the present disclosure.

Fine structural features of the electronic device 2 according to an embodiment of the present disclosure are described below and illustrated by FIG. 3. FIG. 3 is a cross-sectional view of the electronic device 2 taken along the line A-A of FIG. 1 or the line B-B of FIG. 2 according to an embodiment of the present disclosure. In an embodiment of the present disclosure, the electronic device 2 comprises: a substrate 21; a first conductive layer 22 disposed on the substrate 21 and comprising a first connecting pad 221 and a second connecting pad 222; a second conductive layer 23 disposed on and electrically connected to the second connecting pad 222; a first electronic component 24 disposed on and electrically connected to the first connecting pad 221; and a second electronic component 25 disposed on the second conductive layer 23 and electrically connected to the second connecting pad 222 through the second conductive layer 23. The first connecting pad 221 has a first thickness H1. A total thickness of the second connecting pad 222 and the second conductive layer 23 is defined as a second thickness H2. The first thickness H1 is not equal to the second thickness H2. In an embodiment of the present disclosure, the second thickness H2 is greater than the first thickness H1, and the ratio of the second thickness H2 to the first thickness H1 ranges from 1.2 to 5000. For instance, the first thickness H1 is greater than or equal to 0.01 μm and is less than or equal to 5 μm, the second thickness H2 is greater than or equal to 6 μm and is less than or equal to 50 μm. In this embodiment, the first connecting pad 221 and the second connecting pad 222 are portions of the first conductive layer 22 exposed from the second insulating layer 29.

The first conductive layer 22 further comprises a third connecting pad 223. The first electronic component 24 is disposed on the first connecting pad 221 and the third connecting pad 223 and electrically connected to the first connecting pad 221 and the third connecting pad 223. The first connecting pad 221 is electrically insulated from the third connecting pad 223. A first distance D1 is defined as the minimum distance between the first connecting pad 221 and the third connecting pad 223. A second distance D2 is defined as the maximum distance between the first connecting pad 221 and the third connecting pad 223. The average of the first distance D1 and the second distance D2 can be greater than or equal to 5 μm and is less than or equal to 40 μm. In this embodiment, the third connecting pad 223 is a portion of the first conductive layer 22 exposed from the second insulating layer 29. Both the first distance D1 and the second distance D2 are measured in a top view. The first distance D1 is measured by joining the first connecting pad 221 and the third connecting pad 223 with a straight line segment to identify the minimum distance between the first connecting pad 221 and the third connecting pad 223. The second distance D2 is measured as follows: draw a circle that encompasses the first connecting pad 221 and the third connecting pad 223 such that the first connecting pad 221 and third connecting pad 223 each have a point of tangency with the circle, and then join the two points of tangency with another straight line segment. The maximum distance between the first and third connecting pads 221, 223 equals the length of the another straight line segment.

The third connecting pad 223 has a third thickness H3. The present disclosure is not restrictive of the first thickness H1 and the third thickness H3; hence, the first thickness H1 and the third thickness H3 can be designed as needed to meet the requirements of the display device, provided that the second thickness H2 is not equal to the first thickness H1 or the third thickness H3. For instance, the third thickness H3 is greater than or equal to 0.01 µm and is less than or equal to 5 µm. The first thickness H1 and the third thickness H3 are equal or different. In this embodiment, the first electronic component 24 is an active component, such as a transistor or an integrated circuit (IC), but the present disclosure is not limited thereto.

The first conductive layer 22 further comprises a fourth connecting pad 224. A third conductive layer 26 is disposed on and electrically connected to the fourth connecting pad 224. The second electronic component 25 is electrically connected to the second connecting pad 222 through the second conductive layer 23 and electrically connected to the fourth connecting pad 224 through the third conductive layer 26. The second connecting pad 222 is electrically insulated from the fourth connecting pad 224. A third distance D3 is defined as the minimum distance between the second connecting pad 222 and the fourth connecting pad 224. A fourth distance D4 is defined as the maximum distance between the second connecting pad 222 and the fourth connecting pad 224. The average of the third distance D3 and the fourth distance D4 is greater than or equal to 50 µm and is less than or equal to 5000 µm. In this embodiment, the fourth connecting pad 224 is a portion of the first conductive layer 22, exposed from the second insulating layer 29. Both the third distance D3 and the fourth distance D4 are measured in a top view. The third distance D3 is measured by joining the second connecting pad 222 and the fourth connecting pad 224 with a straight line segment to identify the minimum distance between the second connecting pad 222 and the fourth connecting pad 224. The fourth distance D4 is measured as follows: draw a circle that encompasses the second connecting pad 222 and the fourth connecting pad 224 such that the second connecting pad 222 and the fourth connecting pad 224 each have a point of tangency with the circle, and then join the two points of tangency with another straight line segment. The maximum distance between the second connecting pad 222 and fourth connecting pad 224 equals the length of the another straight line segment.

A total thickness of the fourth connecting pad 224 and the third conductive layer 26 is defined as a fourth thickness H4. The present disclosure is not restrictive of the fourth thickness H4; hence, the fourth thickness H4 can be designed as needed to meet the requirements of the display device, provided that the fourth thickness H4 is not equal to the first thickness H1 or the third thickness H3. For instance, the fourth thickness H4 is greater than or equal to 6 µm and is less than or equal to 50 µm. The second thickness H2 and the fourth thickness H4 are equal or different. In this embodiment, the second electronic component 25 is a passive component, such as a capacitor or a resistor, but the present disclosure is not limited thereto.

It is difficult to mount active components and passive components on the same substrate, because active components differ from passive components in three aspects, namely, pin distance, the thickness of a required conductive layer and a required adhesion process. As a result, a connecting element is indispensable. The pins are the exposed projections (wires or bonding pads) from electronic components to connect to the other components or to effectuate detection and analysis. The present disclosure features a simple process whereby active components and passive components are mounted on the same substrate to achieve integration of the connecting element and the circuit board; hence, the present disclosure is effective in reducing the thickness of the display device, attaining narrow bezels, simplifying a process, or reducing costs.

In the situation where the electronic device 2 dispenses with the second conductive layer 23 and the third conductive layer 26 but has the second electronic component 25 directly disposed on the second connecting pad 222 and the fourth connecting pad 224, the second connecting pad 222 and the fourth connecting pad 224 are so thin that the metals comprised in the second connecting pad 222 and the fourth connecting pad 224 are likely to react with the second adhesive element 251 (for example, solder) completely or partially to form an intermetallic compound (IMC). The IMC is fragile and thus likely to cause the pin to sever. Therefore, in this embodiment, the second electronic component 25 is mounted on the second conductive layer 23 and the third conductive layer 26 by the second adhesive element 251 (for example, solder). Not only a total thickness of the second conductive layer 23 and the second connecting pad 222 (i.e., the second thickness H2) is thick enough, but a total thickness of the third conductive layer 26 and the fourth connecting pad 224 (i.e., the fourth thickness H4) is also thick enough; hence, even if the IMC is formed between the second adhesive element 251 (for example, solder) and the second conductive layer 23 and between the second adhesive element 251 (for example, solder) and the third conductive layer 26, the second connecting pad 222 and the fourth connecting pad 224 will still be metallic, or even the second conductive layer 23 and the third conductive layer 26 will still be mostly metal. Therefore, despite the formation of the IMC, the pins are unlikely to sever. The first distance D1 between the first connecting pad 221 and the third connecting pad 223 is shorter than the third distance D3 between the second connecting pad 222 and the fourth connecting pad 224, because the pin distance of the first electronic component 24 is shorter than the pin distance of the second electronic component 25. If the first electronic component 24 is mounted on the first connecting pad 221 and the third connecting pad 223 by a surface-mount technology, the solder on the first connecting pad 221 and the solder on the third connecting pad 223 will connect to each other and thus cause a short circuit. As a result, the surface-mount technology is unfit to mount the first electronic component 24 on the first connecting pad 221 and the third connecting pad 223. By contrast, the first adhesive element 241 on the first electronic component 24 is bonded to the first connecting pad 221 and the third connecting pad 223 by the ACF bonding process or the thermal compressive bonding (TCB) process. Therefore, both the first connecting pad 221 and the third connecting pad 223 can dispense with any conductive layer, and thus the first thickness H1 is less than the second thickness H2.

Figure 4:
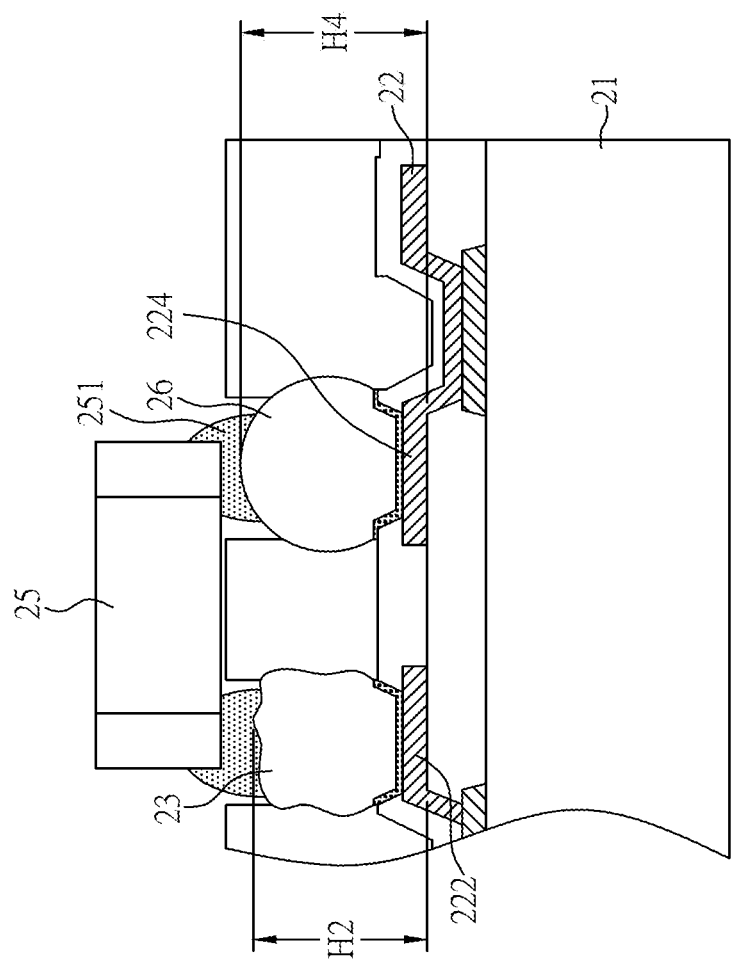
FIG. 4 is a partial cross-sectional view of another electronic device according to another embodiment of the present disclosure.

FIG. 4 is a partial cross-sectional view of another electronic device according to another embodiment of the present disclosure. The electronic device in FIG. 4 is similar to the electronic device in FIG. 3. But the conductive layer in FIG. 4 differs from the conductive layer in FIG. 3 in shape. The present disclosure is not restrictive of the shapes of the second conductive layer 23 and the shape of the third conductive layer 26. According to the present disclosure, the shape of the second conductive layer 23 and the shape of the third conductive layer 26 can be the same or different. For instance, as shown in FIG. 3, both the second conductive layer 23 and the third conductive layer 26 are rectangles and have the same shape. As shown in FIG. 4, the second conductive layer 23 has an irregular shape, the third conductive layer 26 is arcuate, thus they differ in shape. However, the present disclosure is not limited thereto. A total thickness of the second connecting pad 222 and the second conductive layer 23 is defined as the second thickness H2. A total thickness of the fourth connecting pad 224 and the third conductive layer 26 is defined as the fourth thickness H4, but the present disclosure is not restrictive of the second thickness H2 and the fourth thickness H4; hence, the second thickness H2 and the fourth thickness H4 can be designed as needed to meet the requirements of the display device, provided that the second thickness H2 and the fourth thickness H4 are not equal to the first thickness H1 or the third thickness H3. The second thickness H2 and the fourth thickness H4 can be the same or different. For instance, the second thickness H2 is greater than or equal to 6 μm and is less than or equal to 50 μm, the fourth thickness H4 is greater than or equal to 6 μm and is less than or equal to 50 μm.

Features disclosed in the above embodiments of the present disclosure may be combined, so as to create another embodiment.

In conclusion, the display device of the present disclosure enables active components and passive components to be mounted on the same substrate and thereby reduces the thickness of the display device or simplifies a production process thereof, so as to render the display device thin and cut costs.

The display device provided in an embodiment of the present disclosure is applicable to various display devices, which includes a display medium such as organic light-emitting diodes (OLED), quantum dots (QD), fluorescence molecules, phosphors, light-emitting diodes (LED), micro light-emitting diodes (micro LED) or any other display medium. The display device is also applicable to touch display devices which come with a touch panel, non-curved display devices with touch display devices, curved display devices with touch display devices, and flexible display devices with touch display devices.

The above specific embodiments are deemed illustrative, and they are not restrictive of the other part of the present disclosure in whatever manner.

What is claimed is:

1. A display device, comprising:
    a display panel; and
    a circuit board electrically connected to the display panel and comprising:
        a substrate;
        a first conductive layer disposed on the substrate and comprising a first connecting pad and a second connecting pad;
        a second conductive layer disposed on and electrically connected to the second connecting pad;
        a first electronic component disposed on and electrically connected to the first connecting pad; and
        a second electronic component disposed on the second conductive layer and electrically connected to the second connecting pad through the second conductive layer,
    wherein the first connecting pad has a first thickness, a total thickness of the second connecting pad and the second conductive layer is a second thickness, the second thickness is greater than the first thickness, and a ratio of the second thickness to the first thickness ranges from 1.2 to 5000.

2. The display device of claim 1, wherein the first thickness is greater than or equal to 0.01 μm and is less than or equal to 5 μm.

3. The display device of claim 1, wherein the second thickness is greater than or equal to 6 μm and is less than or equal to 50 μm.

4. The display device of claim 1, wherein the first conductive layer further comprises a third connecting pad, the first electronic component is disposed on and electrically connected to the first connecting pad and the third connecting pad, the first connecting pad is electrically insulated from the third connecting pad, a first distance is defined as a minimum distance between the first connecting pad and the third connecting pad, and a second distance is defined as a maximum distance between the first connecting pad and the third connecting pad, wherein an average of the first distance and the second distance is greater than or equal to 5 μm and is less than or equal to 40 μm.

5. The display device of claim 4, wherein the third connecting pad has a third thickness, and the third thickness is greater than or equal to 0.01 μm and is less than or equal to 5 μm.

6. The display device of claim 1, wherein the first conductive layer further comprises: a fourth connecting pad; and a third conductive layer disposed on and electrically connected to the fourth connecting pad, wherein the second electronic component is disposed on the second connecting pad and the fourth connecting pad, the second electronic component is electrically connected to the second connecting pad through the second conductive layer, the second electronic component is electrically connected to the fourth connecting pad through the third conductive layer, the second connecting pad is electrically insulated from the fourth connecting pad, a third distance is defined as a minimum distance between the second connecting pad and the fourth connecting pad, and a fourth distance is defined as a maximum distance between the second connecting pad and the fourth connecting pad, wherein an average of the third distance and the fourth distance is greater than or equal to 50 μm and is less than or equal to 5000 μm.

7. The display device of claim 6, wherein a total thickness of the fourth connecting pad and the third conductive layer is a fourth thickness wherein the fourth thickness is greater than or equal to 6 μm and is less than or equal to 50 μm.

8. The display device of claim 1, wherein a material of the substrate comprises polyethylene terephthalate, polyimide, polyethylene cycloalkane, epoxy resin, fiberglass cloth, or a mixture thereof.

9. The display device of claim 1, wherein the first conductive layer comprises gold, silver, copper, aluminum, molybdenum, titanium, or an alloy thereof.

10. The display device of claim 9, wherein the first conductive layer is a sputtered metal copper layer.

11. An electronic device, comprising:
    a substrate;

a first conductive layer disposed on the substrate and comprising a first connecting pad and a second connecting pad;

a second conductive layer disposed on and electrically connected to the second connecting pad;

a first electronic component disposed on and electrically connected to the first connecting pad; and a second electronic component disposed on the second conductive layer and electrically connected to the second connecting pad through the second conductive layer, wherein the first connecting pad has a first thickness, a total thickness of the second connecting pad and the second conductive layer is a second thickness, the second thickness is greater than the first thickness, and a ratio of the second thickness to the first thickness ranges from 1.2 to 5000.

12. The electronic device of claim 11, wherein the first thickness is greater than or equal to 0.01 μm and is less than or equal to 5 μm.

13. The electronic device of claim 11, wherein the second thickness is greater than or equal to 6 μm and is less than or equal to 50 μm.

14. The electronic device of claim 11, wherein the first conductive layer further comprises a third connecting pad, the first electronic component is disposed on and electrically connected to the first connecting pad and the third connecting pad, the first connecting pad is electrically insulated from the third connecting pad, a first distance is defined as a minimum distance between the first connecting pad and the third connecting pad, and a second distance is defined as a maximum distance between the first connecting pad and the third connecting pad, wherein an average of the first distance and the second distance is greater than or equal to 5 μm and is less than or equal to 40 μm.

15. The electronic device of claim 14, wherein the third connecting pad has a third thickness, and the third thickness is greater than or equal to 0.01 μm and is less than or equal to 5 μm.

16. The electronic device of claim 11, wherein the first conductive layer further comprises: a fourth connecting pad; and a third conductive layer disposed on and electrically connected to the fourth connecting pad, wherein the second electronic component is disposed on the second connecting pad and the fourth connecting pad, the second electronic component is electrically connected to the second connecting pad through the second conductive layer, the second electronic component is electrically connected to the fourth connecting pad through the third conductive layer, the second connecting pad is electrically insulated from the fourth connecting pad, a third distance is defined as a minimum distance between the second connecting pad and the fourth connecting pad, and a fourth distance is defined as a maximum distance between the second connecting pad and the fourth connecting pad, wherein an average of the third distance and the fourth distance is greater than or equal to 50 μm and is less than or equal to 5000 μm.

17. The electronic device of claim 16, wherein a total thickness of the fourth connecting pad and the third conductive layer is a fourth thickness wherein the fourth thickness is greater than or equal to 6 μm and is less than or equal to 50 μm.

18. The electronic device of claim 11, wherein a material of the substrate comprises polyethylene terephthalate, polyimide, polyethylene cycloalkane, epoxy resin, fiberglass cloth, or a mixture thereof.

19. The electronic device of claim 11, wherein the first conductive layer comprises gold, silver, copper, aluminum, molybdenum, titanium, or an alloy thereof.

20. The electronic device of claim 19, wherein the first conductive layer is a sputtered metal copper layer.

* * * * *